United States Patent
Shibayama

(10) Patent No.: US 9,934,199 B2
(45) Date of Patent: Apr. 3, 2018

(54) DIGITAL FILTER DEVICE, DIGITAL FILTERING METHOD, AND STORAGE MEDIUM HAVING DIGITAL FILTER PROGRAM STORED THEREON

(71) Applicant: NEC Corporation, Minato-ku, Tokyo (JP)

(72) Inventor: Atsufumi Shibayama, Tokyo (JP)

(73) Assignee: NEC CORPORATION, Tokyo (JP)

(*) Notice: Subject to any disclaimer, the term of this patent is extended or adjusted under 35 U.S.C. 154(b) by 187 days.

(21) Appl. No.: 14/900,801

(22) PCT Filed: Jun. 20, 2014

(86) PCT No.: PCT/JP2014/003323
§ 371 (c)(1),
(2) Date: Dec. 22, 2015

(87) PCT Pub. No.: WO2015/011874
PCT Pub. Date: Jan. 29, 2015

(65) Prior Publication Data
US 2016/0140083 A1    May 19, 2016

(30) Foreign Application Priority Data
Jul. 23, 2013 (JP) .................. 2013-152705

(51) Int. Cl.
*G06F 17/10* (2006.01)
*G06F 17/14* (2006.01)
(Continued)

(52) U.S. Cl.
CPC .......... *G06F 17/142* (2013.01); *G06F 17/156* (2013.01); *H03H 17/02* (2013.01); *H03H 17/0213* (2013.01)

(58) Field of Classification Search
CPC ...... G06F 17/142; G06F 17/156; H03H 17/02; H03H 17/0213
(Continued)

(56) References Cited

U.S. PATENT DOCUMENTS 5,890,098 A * 3/1999 Kozaki ................ G06F 17/142
702/77
2007/0288542 A1  12/2007 Shih
(Continued)

FOREIGN PATENT DOCUMENTS

JP     08-137832 A    5/1996
JP     2001-056806 A  2/2001
(Continued)

OTHER PUBLICATIONS

International Search Report for PCT Application No. PCT/JP2014/003323, dated Sep. 22, 2014.
(Continued)

*Primary Examiner* — Tan V. Mai

(57) ABSTRACT

In order to reduce the power consumed when using FFT processing and filtering in the frequency domain together, a digital filter device according to the present invention is provided with: a first filtering means for performing a first fast Fourier transformation using a first data sorting process, first filtering in the frequency domain, a first inverse fast Fourier transformation using a second data sorting process, and overlap removal on a first input block including overlapped data; a second filtering means for performing a second fast Fourier transformation, which simultaneously processes all data in a second input block including overlapped data, second filtering in the frequency domain, a second inverse fast Fourier transformation, which simultaneously processes all received filtered data, and overlap removal; and a data selection means for selecting either the first filtering means or the second filtering means, wherein
(Continued)

the operation of the filtering means that is not selected by the data selection means is interrupted.

11 Claims, 10 Drawing Sheets

(51) Int. Cl.
  *G06F 17/15* (2006.01)
  *H03H 17/02* (2006.01)
(58) Field of Classification Search
  USPC .................................. 708/300–323, 400–410
  See application file for complete search history.

(56) References Cited

U.S. PATENT DOCUMENTS

| | | | | |
|---|---|---|---|---|
| 2008/0153450 | A1* | 6/2008 | Atsumi | G06K 19/0702 455/337 |
| 2013/0262545 | A1* | 10/2013 | Shibayama | H03H 17/0248 708/300 |

FOREIGN PATENT DOCUMENTS

| | | |
|---|---|---|
| JP | 2006-304192 A | 11/2006 |
| JP | 2008-506191 A | 2/2008 |
| JP | 2008-182687 A | 8/2008 |
| JP | 2009-535937 A | 10/2009 |
| JP | 2010-130355 A | 6/2010 |
| JP | 2012-022500 A | 2/2012 |
| WO | 2012/086262 A1 | 6/2012 |

OTHER PUBLICATIONS

English translation of Written opinion for PCT Application No. PCT/JP2014/003323.

J. W. Cooley, J. W. Tukey, "An Algorithm for the Machine Calculation of Complex Fourier Series", Mathematics of Computation, US, American Mathematical Society, Apr. 1965, vol. 19, No. 90, pp. 297-301.

D. P. Kolba, "A Prime Factor FFT Algorithm Using High-Speed Convolution", IEEE Trans. on Acoustics, US, IEEE Signal Processing Society, Aug. 1977, vol. 29, No. 4, pp. 281-294.

Japanese Office Action for JP Application No. 2015-528126 dated Aug. 22, 2017 with English Translation.

\* cited by examiner

Fig. 3

|  | ps(0) | ps(1) | ps(2) | ps(3) | ps(4) | ps(5) | ps(6) | ps(7) |
|---|---|---|---|---|---|---|---|---|
| P1 | 0 | 1 | 2 | 3 | 4 | 5 | 6 | 7 |
| P2 | 8 | 9 | 10 | 11 | 12 | 13 | 14 | 15 |
| P3 | 16 | 17 | 18 | 19 | 20 | 21 | 22 | 23 |
| P4 | 24 | 25 | 26 | 27 | 28 | 29 | 30 | 31 |
| P5 | 32 | 33 | 34 | 35 | 36 | 37 | 38 | 39 |
| P6 | 40 | 41 | 42 | 43 | 44 | 45 | 46 | 47 |
| P7 | 48 | 49 | 50 | 51 | 52 | 53 | 54 | 55 |
| P8 | 56 | 57 | 58 | 59 | 60 | 61 | 62 | 63 |

CYCLE: 1, 2, 3, 4, 5, 6, 7, 8

Fig. 4

|     | qs(0) | qs(1) | qs(2) | qs(3) | qs(4) | qs(5) | qs(6) | qs(7) |
|-----|-------|-------|-------|-------|-------|-------|-------|-------|
| Q1  | 0     | 8     | 16    | 24    | 32    | 40    | 48    | 56    |
| Q2  | 1     | 9     | 17    | 25    | 33    | 41    | 49    | 57    |
| Q3  | 2     | 10    | 18    | 26    | 34    | 42    | 50    | 58    |
| Q4  | 3     | 11    | 19    | 27    | 35    | 43    | 51    | 59    |
| Q5  | 4     | 12    | 20    | 28    | 36    | 44    | 52    | 60    |
| Q6  | 5     | 13    | 21    | 29    | 37    | 45    | 53    | 61    |
| Q7  | 6     | 14    | 22    | 30    | 38    | 46    | 54    | 62    |
| Q8  | 7     | 15    | 23    | 31    | 39    | 47    | 55    | 63    |

CYCLE: 1 2 3 4 5 6 7 8

US 9,934,199 B2

DIGITAL FILTER DEVICE, DIGITAL FILTERING METHOD, AND STORAGE MEDIUM HAVING DIGITAL FILTER PROGRAM STORED THEREON

This application is a National Stage Entry of PCT/JP2014/003323 filed on Jun. 20, 2014, which claims priority from Japanese Patent Application 2013-152705 filed on Jul. 23, 2013, the contents of all of which are incorporated herein by reference, in their entirety.

TECHNICAL FIELD

The present invention relates to computation processing circuits in digital signal processing and, in particular, to a digital filter device.

BACKGROUND ART

One of the most important processes in digital signal processing is a fast Fourier transform (hereinafter called "FFT"). Also, for example, frequency domain equalization (FDE) is a technique to compensate for waveform distortion which may be caused during signal transmission in wireless or wired communications. At the frequency domain equalization (FDE), first, time-domain signal data is converted into frequency-domain data by a fast Fourier transform, next, filtering is carried out for equalization. Then, the filtered data undergoes an inverse fast Fourier transform (inverse FFT; hereinafter called "IFFT") to be reconverted into time-domain signal data, resulting in compensating for waveform distortion in the original time-domain signals. Unless either FFT or IFFT is distinctively referred to, both are hereinafter denoted as "FFT/IFFT".

Generally, the FFT/IFFT processing involves a "butterfly computation". For example, an FFT device involving a butterfly computation is described in PTL 1. In the PTL 1, a "twiddle multiplication", described below, which is a multiplication by a twiddle factor, is also described.

For example, the Cooley-Tukey butterfly computation is described in NPL 1 as an efficient FFT/IFFT processing method. However, the Cooley-Tukey FFT/IFFT uses a large number of points and thus requires a complex circuit. Hence, the FFT/IFFT processing is performed by decomposing into two smaller FFTs/IFFTs based on, for example, the Prime Factor method described in NPL 2.

FIG. 8 shows a data flow diagram 500 illustrating a 64-point FFT decomposed into two-stage radix-8 butterfly processes by utilizing, for example, the Prime Factor method. The data flow 500 includes a data sorting process 501, radix-8 butterfly computation processes consisting of butterfly computation processes 502 and 503 performed sixteen times in total, and a twiddle multiplication process 504.

With reference to the data flow shown in FIG. 8, the inputted time-domain data x(n) (where n=0, 1, . . . , 63) is Fourier-transformed into frequency-domain signals X(k) (where k=0, 1, . . . , 63) through FFT processing. Note that the data flow illustration in FIG. 8 is partly omitted. Also note that a data flow structure for IFFT processing is basically the same as shown in FIG. 8.

For a large number of FFT points, huge circuitry will be required to implement the whole data flow in FIG. 8 in circuits. Thus, a typical method employed for a large number of FFT points is to implement the whole FFT process by repetitively using a circuit that implements a part of the data flow, depending on the desired processing performance.

For example, with reference to the data flow shown in FIG. 8, if an FFT device in the form of a physical circuit is created so as to perform the FFT processing on eight pieces of data in parallel (hereinafter called "in 8-data parallel" for short), repeating the processing eight times in total can achieve the 64-point FFT processing.

The eight-time repetitive processing in sequence consists of partial data flows 505a to 505h, each of which handles eight pieces of data as described in more detail below. That is, the first process corresponding to the partial data flow 505a is performed, followed by the second process corresponding to the partial data flow 505b, followed by the third process corresponding to the partial data flow 505c (not shown). Similarly, subsequent individual processes are performed in sequence up to the eighth one corresponding to the partial data flow 505h. These processes achieve the 64-point FFT processing.

In a butterfly computation, pieces of data arranged in a sequential order are read and processed in an order pursuant to a predetermined rule. Hence, a butterfly computation requires rearrangement of data, for which purpose random access memory (RAM) is used. For example, PTL 2 describes an FFT device which uses RAM for data rearrangement during a butterfly computation.

In addition, PTL 3 for example, describes a speed-enhancing technique through parallel processing of a butterfly computation on an FFT computation device which consumes less memory amount.

Incidentally, it is assumed in FFTs that a dataset identical to sequential pieces of input data, that is a range of input signals cut out for processing (hereinafter called a "process block"), cyclically occurs. However, an actual input signal is not always a periodic signal, which poses the problem of computational distortion occurring around both ends of a process block after FFT processing.

Techniques to solve this problem may include, for example, the "overlap method". According to the overlap method, an FFT is performed on input signals arranged so as to overlap adjacent process blocks each other by a predetermined number of data pieces. Then, the post-FFT data is filtered and reconverted into time-domain signals through an IFFT, and finally only the signal data at both ends of a process block where computational distortion has occurred is removed.

The overlap method is applied to FDE (see PTL 4 and 5, for example). The following describes the overlap FDE method. FIG. 9 is a block diagram illustrating an example configuration of a digital filter circuit 700 according to the overlap FDE method. The digital filter circuit 700 is a frequency-domain filter circuit where filtering is carried out in the frequency domain. Specifically, time-domain signals are inputted as input data, transformed into frequency-domain data through an FFT, and then filtered. Subsequently, the filtered signals are re-transformed into time-domain signals through an IFFT and then outputted as output signals.

The digital filter circuit 700 includes an overlap addition circuit 710, an FFT circuit 711, a filter computation circuit 712, an IFFT circuit 713, and an overlap removal circuit 714.

The overlap addition circuit 710 sequentially generates blocks each of which is composed of N pieces of data (where N is a positive integer) from the input data representing time-domain input signals to output the blocks to the FFT circuit 711. During this operation, the overlap addition circuit 710 makes every two consecutive blocks overlap each other by M pieces of data (where M is a positive integer). The circuit may be configured to have a fixed predetermined number of overlapped data pieces M, or may be configured to set the number of overlapped data pieces during operations by, for example, referencing a value given by an upper-level circuit (not shown), such as a central processing unit (CPU), as the specified overlap value. Note that the overlap addition circuit 710 can be structured by a 2-port memory, for example.

The FFT circuit 711 performs an FFT on the time-domain input signals overlapping each other by M pieces of data as outputted from the overlap addition circuit 710, thereby transforming into frequency-domain signals, and then outputs the signals to the filter computation circuit 712.

The filter computation circuit 712 performs filtering on the frequency-domain signals that underwent a transform through the FFT circuit 711, and then outputs the filtered signals to the IFFT circuit 713. For example, if the digital filter circuit 700 performs equalization of signal distortion in a communication channel, the filter computation circuit 712 can be structured by a complex number multiplier.

The IFFT circuit 713 performs an IFFT on the filtered frequency-domain signals as outputted from the filter computation circuit 712, thereby re-transforming into time-domain signals, and then outputs the signals to the overlap removal circuit 714.

The overlap removal circuit 714 removes a total of M pieces of data from both ends of a block consisting of N pieces of data, which has been re-transformed into time-domain signals through the IFFT circuit 713, thereby taking out only the middle portion of a block and outputs it as output data.

Operations of the digital filter circuit 700 shown in FIG. 9 will now be described with reference to FIG. 10. FIG. 10 is a sequence diagram illustrating example operations of the digital filter circuit shown in FIG. 9. Process steps (1) to (5) in the following description correspond to process steps (1) to (5) in FIG. 10, respectively.

(1) Overlap Addition Processing

The overlap addition circuit 710 sequentially generates blocks each of which is composed of N pieces of data (where N is a positive integer) from the input data representing time-domain input signals. During this operation, the overlap addition circuit 710 makes every two consecutive blocks overlap each other by M pieces of data (where M is a positive integer).

Assume that input data is represented by:

$x[i](i=0,1,\ldots)$ then a block consisting of N pieces of data is represented by:

$x[j](j=m(N-M)\sim N\sim m(N-M)-1)$, where $m$ is a positive integer)

where N represents the FFT block size and M represents the overlap value.

(2) FFT Processing

The FFT circuit 711 performs an FFT on a block consisting of time-domain signals to transform the block into a block consisting of frequency-domain signal data.

Again assume that a block consisting of N pieces of time-domain signal data is represented by:

$x[n](n=0,1,\ldots,N-1)$ then a frequency-domain block that underwent the FFT is given by:

$X[k](k=0,1,\ldots,N-1)$.

(3) Frequency Domain Filtering

The filter computation circuit 712 performs filtering on each set of frequency-domain signal data consisting of a block that underwent the FFT.

A block that underwent filtering on a pre-filtering block X[k] is give by:

$X'[k]=H(k)\cdot X[k](k=0,1,\ldots,N-1)$ where H(k) represents a filter factor.

(4) IFFT Processing

The IFFT circuit 713 performs an IFFT on a block consisting of frequency-domain filtered signals to re-transform the block into a block consisting of time-domain signal data.

A block that underwent an IFFT performed on a pre-IFFT block X'[k] is given by:

$y[n](n=0,1,\ldots,N-1)$.

(5) Overlap Removal Processing

The overlap removal circuit 714 removes M/2 pieces of overlapped data at each of the head and the end of a block y[n] that consists of N pieces of post-IFFT signal data to take out the remaining middle portion.

Consequently, a sequence of (N−M) pieces of signal data which has overlaps removed and is represented by:

$y'[j](j=M/2\sim(N-1)-M/2)$ is generated.

Regarding specific processing, some digital filter circuits handle the overlapping using a general filtering process that is not necessarily limited to FDE or the like (see PTL 6, for example). The digital filter circuit disclosed in PTL 6 also performs overlap addition, FFT, frequency-domain filtering, IFFT, and overlap removal.

Meanwhile, an amount of overlap required for a filter used for the overlapping process is determined based on the impulse response length of the performed filtering. In addition, for an FFT process, a process block needs to be larger than the required amount of overlap. Accordingly, the size of a process block for an FFT is determined based on the impulse response length of the filtering.

Some techniques can reduce an amount of hardware in an apparatus used for performing FFTs on blocks of varying size (see PTL 7, for example). The orthogonal transform processor according to PTL 7 is adapted to the length of an FFT vector (which is equivalent to a "process block") to size the memory accordingly, disable unnecessary circuit blocks, or time-share the operating hardware.

CITATION LIST

Patent Literature

[PTL 1] Japanese Unexamined Patent Application Publication No. H8-137832 (pp. 3-5, FIG. 25)
[PTL 2] Japanese Unexamined Patent Application Publication No. 2001-56806 (p. 5, FIG. 1)
[PTL 3] Japanese Unexamined Patent Application Publication No. 2012-22500 (p. 5, FIG. 1)
[PTL 4] Japanese Unexamined Patent Application Publication No. 2006-304192 (pp. 4-5, FIG. 4)
[PTL 5] Japanese Unexamined Patent Application Publication No. 2010-130355 (pp. 3-6, FIG. 6)
[PTL 6] International Unexamined Patent Publication No. 2012/086262 (pp. 3-4, FIG. 1)
[PTL 7] Japanese Unexamined Patent Application Publication (Translation of PCT Application) No. 2008-506191 (pp. 11-12, FIGS. 11 and 12)

Non Patent Literature

[NPL 1] J. W. Cooley, J. W. Tukey, "An Algorithm for the Machine Calculation of Complex Fourier Series," Mathematics of Computation, US, American Mathematical Society, April 1965, Vol. 19, No. 90, pp. 297-301

[NPL 2] D. P. Kolba, "A Prime Factor FFT Algorithm Using High-Speed Convolution," IEEE Trans. on Acoustics, US, IEEE Signal Processing Society, August 1977, Vol. 29, No. 4, pp. 281-294

SUMMARY OF INVENTION

Technical Problem

As described above, the size of a process block for FFT depends on the impulse response length of a filtering process. Accordingly, a larger amount of overlap and thus a larger process block for FFT are needed for a longer impulse response length. As a result, there arises a problem that involves larger circuits and increased power consumption required for processing.

As seen above, if an FFT process is used in conjunction with frequency-domain filtering and with overlapping, the processing requires a larger circuit and greater power consumption as the impulse response length of a filter increases. It is therefore desirable to optimize the size of an operating circuit and minimize power consumption depending on properties of the filter.

In contrast, FFT devices described in any of PTL 1 to 3 and NPL 1 and 2 do not particularly provide controls, including optimization of the size of an operating circuit or control of power consumption, adapted to change in process blocks.

Filtering methods that employ overlapping as described in PTL 4 to 6 do not perform a process focusing on the impulse response of a filter, either. Thus, the methods described in PTL 4 to 6 still fail to solve the above-described problem.

Although the orthogonal transform processor described in PTL 7 determines the memory size, disables unnecessary circuit blocks, or time-shares the operating hardware, it still requires a data sorting process in an FFT/IFFT itself. In general, a data sorting process requires a memory having capacity to store all the data in a process block. Consequently, there is a problem that involves a higher-capacity memory, a larger circuit for processing, and greater power consumption needed for a longer impulse response length of filtering and a larger process block.

Object of the Invention

An object of the present invention is to provide a digital filter device that can reduce power consumption in a case where an FFT process is used in conjunction with filtering in a frequency domain.

Solution to Problem

A digital filter device according to the present invention comprises: first digital filtering means comprising: first overlap addition means which generates a first overlap block where a first input block comprising time-domain consecutive N–M pieces of input data (where N is a positive integer and M is a positive integer equal to or less than N) is given additional consecutive M pieces of data immediately preceding the first input block; first fast Fourier transform means which transforms, through a fast Fourier transform process involving a first data sorting process, the first overlap block into a first frequency-domain block being in a frequency domain; first filter computation means which performs a first filtering process on the first frequency-domain block; first inverse fast Fourier transform means which transforms, through an inverse fast Fourier transform process involving a second data sorting process, the first processed block which underwent the first filtering process into a first time-domain block; and first overlap removal means which removes a total of M pieces of data from both ends of a time axis of the first time-domain block and generates first output data; second digital filtering means comprising: second overlap addition means which generates a second overlap block where a second input block comprising time-domain consecutive Q–P pieces of input data (where Q is a positive integer and P is a positive integer equal to or less than Q) is given additional consecutive P pieces of data immediately preceding the second input block; second fast Fourier transform means which simultaneously inputs all the second input block included in the second overlap block and transforms, through a fast Fourier transform process, the block into a second frequency-domain block being in a frequency domain; second filter computation means which performs a second filtering process on the second frequency-domain block; second inverse fast Fourier transform means which simultaneously inputs all processed data included in the second processed block which underwent the second filtering process and transforms, through an inverse fast Fourier transform process, the processed data into a second time-domain block; and second overlap removal means which removes a total of P pieces of data from both ends of a time axis of the second time-domain block and generates second output data; and data selection means which selects either the first output data or the second output data in accordance with a selection signal selecting a filtering process to be performed, wherein the second digital filtering means stops operating when the first output data is selected by the data selection means, and wherein the first digital filtering means stops operating when the second output data is selected by the data selection means.

A digital filtering method according to the present invention comprises: selecting, in accordance with a selection signal selecting a filtering process to be performed, either: a first digital filtering process performed to: generate a first overlap block where a first input block comprising time-domain consecutive N–M pieces of input data (where N is a positive integer and M is a positive integer equal to or less than N) is given additional consecutive M pieces of data immediately preceding the first input block; transform, through a fast Fourier transform process involving a first data sorting process, the first overlap block into a first frequency-domain block being in a frequency domain; perform a first filtering process on the first frequency-domain block; transform, through an inverse fast Fourier transform process involving a second data sorting process, the first processed block which underwent the first filtering process into a first time-domain block; and remove a total of M pieces of data from both ends of a time axis of the first time-domain block and generate first output data; or a second digital filtering process performed to: generate a second overlap block where a second input block comprising time-domain consecutive Q–P pieces of input data (where Q is a positive integer and P is a positive integer equal to or less than Q) is given additional consecutive P pieces of data immediately preceding the second input block; simultaneously input all the second input block included in the second overlap block and transform, through a fast Fourier transform process, the block into a second frequency-domain block being in a frequency domain; perform a second filtering process on the second frequency-domain block; simultaneously input all processed data included in the second processed block which underwent the second filtering process and transform, through an inverse fast Fourier transform process, the processed data into a second time-domain block; and remove a total of P pieces of data from both ends of a time axis of the second time-domain block and generate second output data; stopping the first digital filtering process when the second digital filtering process is selected; and stopping the second digital filtering process when the first digital filtering process is selected.

A storage medium storing a digital filter program according to the present invention causes a computer included in a digital filter device to function as: first digital filtering means which generates a first overlap block where a first input block comprising time-domain consecutive N–M pieces of input data (where N is a positive integer and M is a positive integer equal to or less than N) is given additional consecutive M pieces of data immediately preceding the first input block; transforms, through a fast Fourier transform process involving a first data sorting process, the first overlap block into a first frequency-domain block being in a frequency domain; performs a first filtering process on the first frequency-domain block; transforms, through an inverse fast Fourier transform process involving a second data sorting process, the first processed block which underwent the first filtering process into a first time-domain block; and removes a total of M pieces of data from both ends of a time axis of the first time-domain block and generates first output data; second digital filtering means which generates a second overlap block where a second input block comprising time-domain consecutive Q–P pieces of input data (where Q is a positive integer and P is a positive integer equal to or less than Q) is given additional consecutive P pieces of data immediately preceding the second input block; simultaneously inputs all the second input block included in the second overlap block and transforms, through a fast Fourier transform process, the block into a second frequency-domain block being in a frequency domain; performs a second filtering process on the second frequency-domain block; simultaneously inputs all processed data included in the second processed block which underwent the second filtering process and transforms, through an inverse fast Fourier transform process, the processed data into a second time-domain block; and removes a total of P pieces of data from both ends of a time axis of the second time-domain block and generates second output data; selection means which selects either the first digital filtering means or the second digital filtering means in accordance with a selection signal selecting a filtering process to be performed; and stopping means which stops the first digital filtering means when the second digital filtering means is selected and stops the second digital filtering means when the first digital filtering means is selected.

Advantageous Effects of Invention

According to the present invention, power consumption can be reduced in a case where an FFT process is used in conjunction with filtering in a frequency domain.

BRIEF DESCRIPTION OF DRAWINGS

FIG. 3 is a diagram illustrating datasets arranged in a sequential order according to an exemplary embodiment of the present invention.

FIG. 4 is a diagram illustrating datasets arranged in a bit reverse order according to an exemplary embodiment of the present invention.

DESCRIPTION OF EMBODIMENTS

Figure 1:
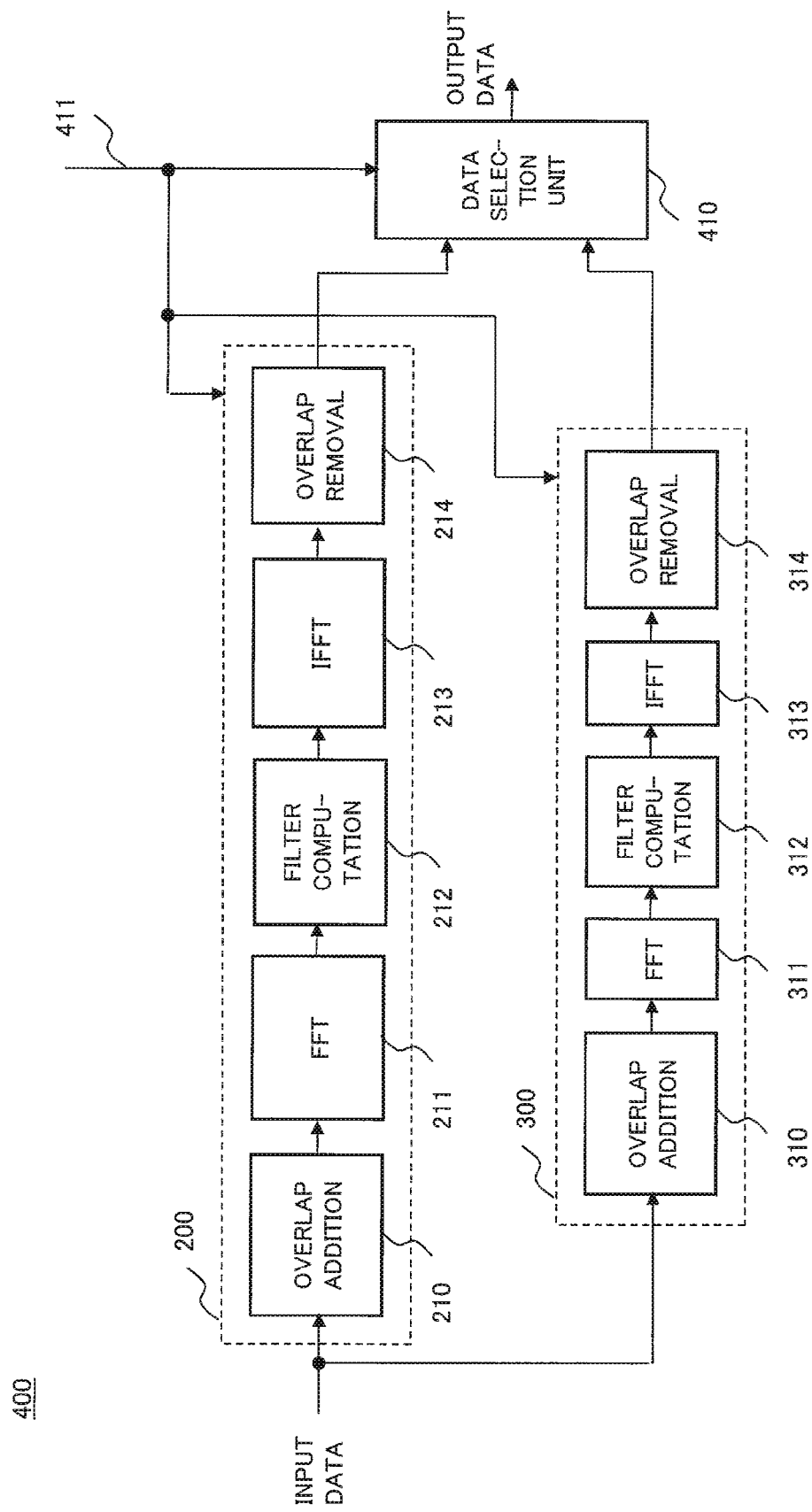
FIG. 1 is a block diagram illustrating a configuration of a digital filter circuit according to an exemplary embodiment of the present invention.

Embodiments of the present invention will now be described in detail with reference to the drawings. FIG. 1 is a block diagram illustrating an example configuration of a digital filter circuit 400 according to an exemplary embodiment of the present invention.

The digital filter circuit 400 includes a first digital filter circuit 200, a second digital filter circuit 300, and a data selection unit 410. Thus, the digital filter circuit 400 is structured with two digital filter circuits 200 and 300 being connected in parallel.

Input data inputted to the digital filter circuit 400 is subjected to filtering through either the first digital filter circuit 200 or the second digital filter circuit 300, based on a selection signal 411 given by an upper-level circuit (not shown) such as a CPU.

According to the selection signal 411, the data selection unit 410 selects data filtered through either the first digital filter circuit 200 or the second digital filter circuit 300 and outputs the selected data as output data.

The first and second digital filter circuits 200 and 300 perform filtering, such as FDE, based on the overlap method.

The first digital filter circuit 200 includes an overlap addition circuit 210, an FFT circuit 211, a filter computation circuit 212, an IFFT circuit 213, and an overlap removal circuit 214.

The overlap addition circuit 210 sequentially generates input blocks each of which is composed of consecutive N pieces of data (where N is a positive integer) from the input data representing time-domain input signals and outputs the blocks to the FFT circuit 211. During this operation, the overlap addition circuit 210 overlaps each input block with the immediately preceding block at its end by M pieces of data (where M is a positive integer). "Overlap" as used herein means that the first predetermined X pieces of data of a block (where X is a positive integer) are handled as the last X pieces of data in the immediately preceding block and that the X pieces of data overlapping between two blocks are included in each of the two blocks. The overlap addition circuit 210 generates an "overlap block", which consists of consecutive N pieces of data including M pieces of overlapped data. Note that the overlap addition circuit 210 is structured by a 2-port memory, for example.

The FFT circuit 211 performs an N-point fast Fourier transform (FFT) on an overlap block outputted from the overlap addition circuit 210 to transform the block into a frequency-domain signal. Then, the FFT circuit 211 outputs to the filter computation circuit 212 a "frequency-domain block", which consists of N pieces of frequency-domain data.

The filter computation circuit 212 performs filtering on the frequency-domain block outputted from the FFT circuit 211, and then outputs the "processed block" to the IFFT circuit 213. For example, if the digital filter circuit 200 performs equalization of signal distortion, i.e., FDE, in a communication channel, the filter computation circuit 212 can be composed of a complex number multiplier.

The IFFT circuit 213 performs an N-point inverse fast Fourier transform (IFFT) on the processed block outputted from the filter computation circuit 212 to re-transform the block into a time-domain signal. Then, the IFFT circuit 213 outputs to the overlap removal circuit 214 the "time-domain block", which consists of N pieces of time-domain data.

The overlap removal circuit 214 removes a total of M pieces of data from both ends of a time axis of each time-domain block outputted from the IFFT circuit 213, takes out only the middle portion of the time-domain block, and outputs the portion as "output data".

The overlap value M may be a predetermined fixed value. In this case, the overlap addition circuit 210 and the overlap removal circuit 214 can be configured to be suited to the overlap value M. Alternatively, an overlap value M may be given by an upper-level circuit, such as a CPU (not shown), to be defined as an overlap value setting during operations. As described above, an overlap value M may be a predetermined fixed value or an externally defined value; provided, however, an overlap value M must be smaller than a block size N for FFT. In the present exemplary embodiment, the values are set to: M=16 and N=64.

Similarly, the second digital filter circuit 300 includes an overlap addition circuit 310, an FFT circuit 311, a filter computation circuit 312, an IFFT circuit 313, and an overlap removal circuit 314.

The overlap addition circuit 310 sequentially generates input blocks each of which is composed of consecutive Q pieces of data (where Q is a positive integer) from the input data representing time-domain input signals and outputs the blocks to the FFT circuit 311. During this operation, the overlap addition circuit 310 overlaps each block with the immediately preceding block at its end by P pieces of data (where P is a positive integer). The overlap addition circuit 310 generates an overlap block, which consists of consecutive Q pieces of data including P pieces of overlapped data.

The FFT circuit 311 performs a Q-point fast Fourier transform (FFT) on an overlap block outputted from the overlap addition circuit 310 to transform the block into a frequency-domain signal. Then, the FFT circuit 311 outputs to the filter computation circuit 312 a frequency-domain block, which consists of Q pieces of frequency-domain data.

The filter computation circuit 312 performs filtering on the frequency-domain block outputted from the FFT circuit 311, and then outputs the processed block to the IFFT circuit 313.

The IFFT circuit 313 performs a Q-point inverse fast Fourier transform (IFFT) on the processed block outputted from the filter computation circuit 312 to re-transform the block into a time-domain signal. Then, the IFFT circuit 313 outputs to the overlap removal circuit 314 a time-domain block, which consists of Q pieces of time-domain data.

The overlap removal circuit 314 removes a total of P pieces of data from both ends of a time axis of each time-domain block outputted from the IFFT circuit 313, takes out only the middle portion of the time-domain block, and outputs the portion as output data.

An overlap value Q may also be a predetermined fixed value or may be given by an upper-level circuit, such as a CPU, to be defined during operations. In either case an overlap value must be smaller than a block size Q for FFT. In addition, the present exemplary embodiment assumes that the block size Q for FFT in the second digital filter circuit 300 is smaller than the block size N for FFT in the first digital filter circuit 200. Specifically, the values are set to: P=4 and Q=16.

A configuration of the FFT circuit 211, which is a component of the first digital filter circuit 200, will now be described.

Figure 2:
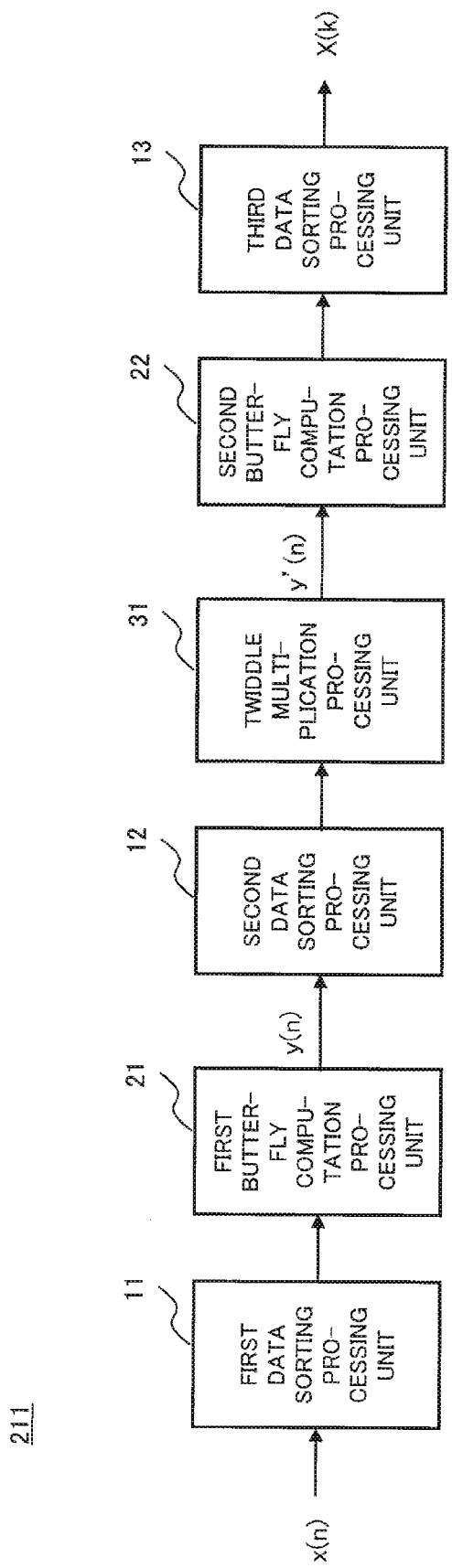
FIG. 2 is a block diagram illustrating a configuration of an FFT circuit according to an exemplary embodiment of the present invention.

FIG. 2 is a block diagram illustrating an example configuration of the FFT circuit 211 according to an exemplary embodiment of the present invention.

Figure 8:
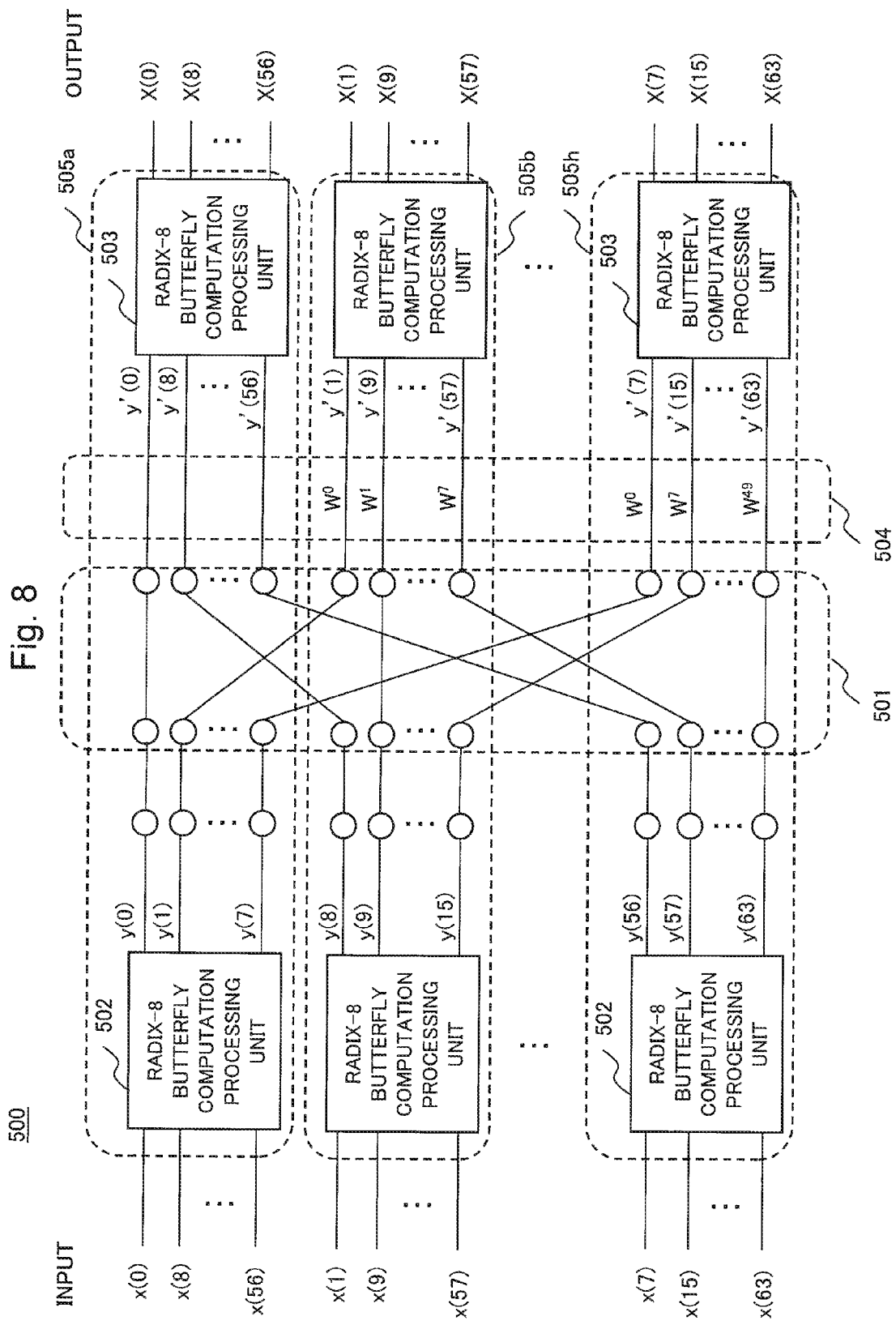
FIG. 8 is a diagram illustrating a data flow for a 64-point FFT involving two-stage butterfly computations.
Figure 9:
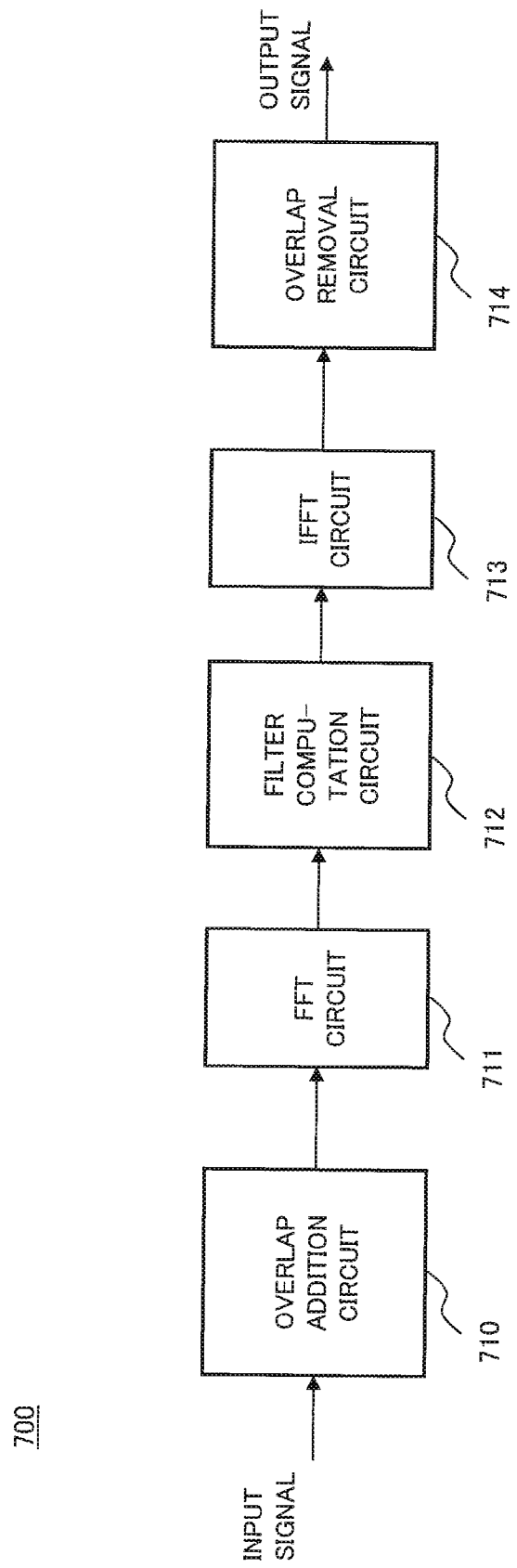
FIG. 9 is a block diagram illustrating a configuration of an FFT circuit.
Figure 10:
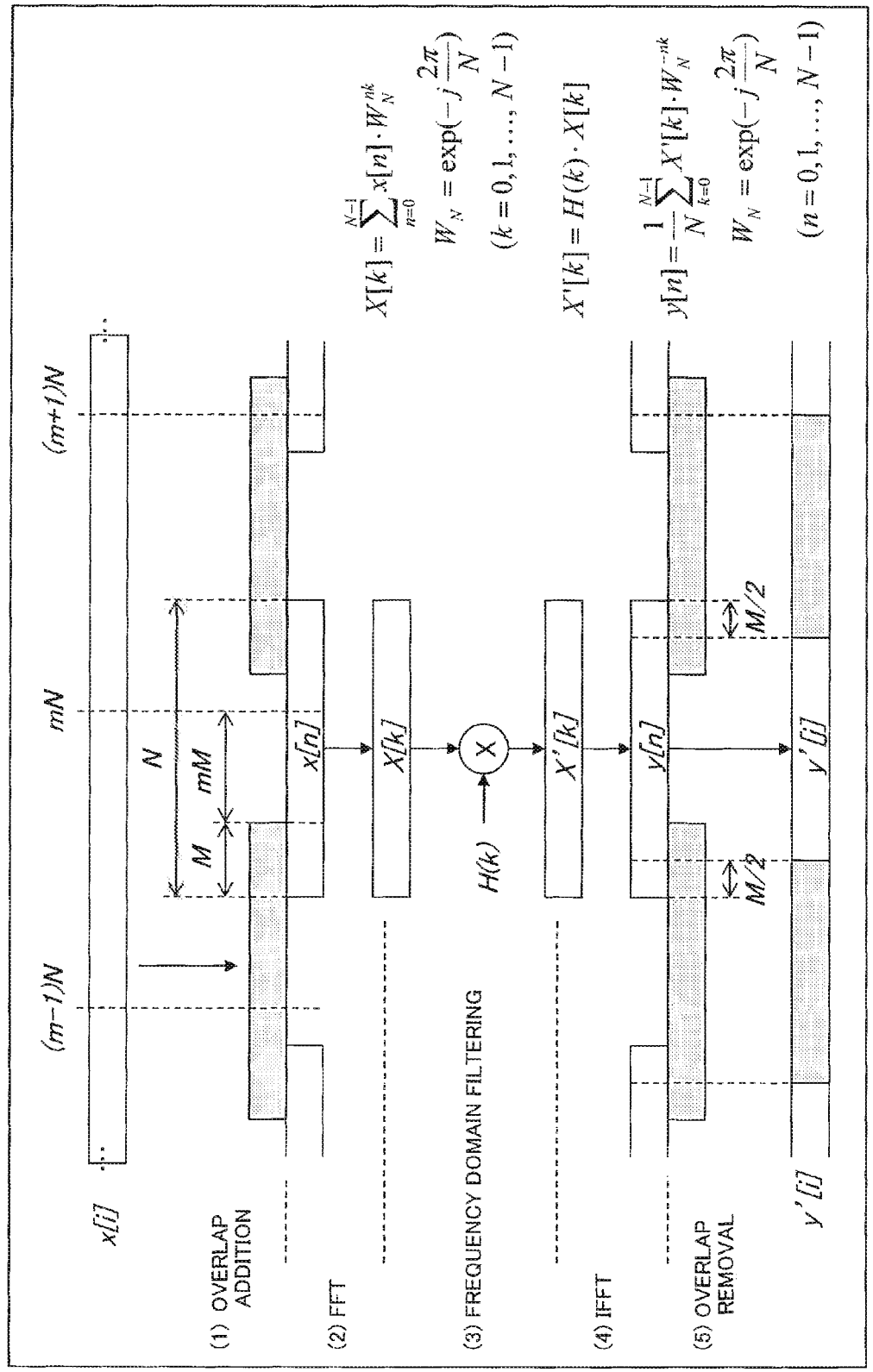
FIG. 10 is an operation diagram illustrating example operations of a digital filter circuit based on an overlap FDE method.

The FFT circuit 211 processes a 64-point FFT decomposed into two-stage radix-8 butterfly processes based on a pipelined circuit system, according to the data flow 500 shown in FIG. 8. When time-domain data x(n) (where n=0, 1, . . . , 63) is inputted, the FFT circuit 211 performs a Fourier transform through an FFT process on the data to generate and output frequency-domain signals X(k) (k=0, 1, . . . , 63).

In order to implement the 64-point FFT process shown in the data flow in FIG. 8, i.e., all the processes performed on 8 sets of data each including 8 pieces of data, by using 8 separate circuits respectively for each set, huge circuitry would be needed. It is therefore assumed that the FFT circuit 211 performs a 64-point FFT process in 8-data parallel. In this case, the FFT circuit 211 performs a Fourier transform through an FFT process on inputted time-domain data x(n) to generate and output frequency-domain signals X(k). During the processing, input data x(n), which consists of 64 pieces of data in total, is inputted in the order shown in FIG. 3 in units of 8 pieces of data at a time during a period of 8 cycles. Note that the numbers 0 to 63 shown as content of the table in FIG. 3 represent n in x(n).

Specifically, in the 1st cycle, 8 pieces of data x(0), x(1), . . . , x(7) constituting a dataset P1 are inputted. Next, in the 2nd cycle, 8 pieces of data x(8), x(9), . . . , x(15) constituting a dataset P2 are inputted. Similarly, in each of the 3rd to 8th cycles, the pieces of data respectively constituting datasets P3 to P8 are inputted.

Likewise, the output data X(k) consisting of 64 pieces of data is outputted in the order shown in FIG. 3 in units of 8 pieces of data at a time during a period of 8 cycles. Note that the numbers 0 to 63 shown as content of the table in FIG. 3 represent k in X(k).

Specifically, in the 1st cycle, 8 pieces of data X(0), X(1), . . . , X(7) constituting a dataset P1 are outputted. In the 2nd cycle, 8 pieces of data X(8), X(9), . . . , X(15) constituting a dataset P2 are outputted. Similarly, in each of the 3rd to 8th cycles, the pieces of data respectively constituting datasets P3 to P8 are outputted.

The FFT circuit 211 includes a first data sorting processing unit 11, a first butterfly computation processing unit 21, a second data sorting processing unit 12, a twiddle multiplication processing unit 31, a second butterfly computation processing unit 22, and a third data sorting processing unit 13. The FFT circuit 211 performs a first data sorting process, a first butterfly computation process, a second data sorting process, a twiddle multiplication process, a second butterfly computation process, and a third data sorting process in a pipelined manner.

The first and second data sorting processing units 11 and 12 are buffer circuits for rearranging data. The first and second data sorting processing units 11 and 12 respectively rearrange a data sequence both before and after the first butterfly computation processing unit 21 based on data dependence in the FFT processing algorithm.

Likewise, the third data sorting processing unit 13 is a buffer circuit for rearranging data. That is, the third data sorting processing unit 13 rearranges a data sequence subsequent to the second butterfly computation processing unit 22 based on data dependence in the FFT processing algorithm. In addition to the above data rearrangement, the third data sorting processing unit 13 makes a data rearrangement aiming at outputting X(k) and X(N-k) for any k in the FFT circuit 211 within a time lag as few as one cycle or less.

Specifically, the first data sorting processing unit 11 rearranges the input data x(n), which has been inputted in a "sequential order" shown in FIG. 3, in a "bit reverse order" shown in FIG. 4, in which order the data will be inputted to the first butterfly computation processing unit 21.

The bit reverse order shown in FIG. 4 corresponds to the datasets inputted to the radix-8 butterfly process 502 in the 1st stage, as illustrated in the data flow diagram in FIG. 8. Specifically, in the 1st cycle, 8 pieces of data x(0), x(8), ..., x(56) constituting a dataset P1 are set. Next, in the 2nd cycle, 8 pieces of data x(1), x(9), ..., x(57) constituting a dataset P2 are set. Similarly, in each of the 3rd to 8th cycles, the pieces of data respectively constituting datasets P3 to P8 are set.

The terms "sequential order" and "bit reverse order" are now explained in detail. The term "sequential order" refers to an order of eight datasets P1, P2, P3, P4, P5, P6, P7, and P8 as shown in FIG. 3. A dataset Ps (where s represents an ordinal number of a processing cycle; s=1, ..., 8) consists of 8 pieces of data ps(0) to ps(7) sequentially arranged, and ps(i) is expressed as:

$$ps(i)=8(s-1)+i$$

Further, the individual datasets are arranged in the order of P1, P2, P3, P4, P5, P6, P7, and P8 with the progress of processing cycles. In other words, a sequential order is an arrangement of is pieces of data, where s datasets each consisting of i pieces of data are created and arranged in the order of cycle number.

The term "bit reverse order" refers to an order of eight datasets Q1, Q2, Q3, Q4, Q5, Q6, Q7, and Q8 as shown in FIG. 4. A dataset Qs consists of eight pieces of data qs(0) to qs(7), and qs(i) is expressed as:

$$qs(i)=(s-1)+8i$$

Further, the individual datasets are arranged in the order of Q1, Q2, Q3, Q4, Q5, Q6, Q7, and Q8 with the progress of processing cycles. In other words, a bit reverse order is a rearrangement of is pieces of data that have been inputted in a sequential order, where the pieces of data are arranged in the order of cycle in units of s and datasets each consisting of i pieces of data of the same cycle are arranged in the order of data.

As seen above, once individual datasets are arranged in a sequential order, individual datasets arranged in a bit reverse order are uniquely identified. The ith data piece in a dataset Qs (where s=1, ..., 8) in a bit reverse order corresponds to the sth data piece in the ith cycle in a sequential order. That is:

$$Qs(i)=Pi(s)$$

Thus, Qs(i) and Pi(s) are correlated such that, with respect to pieces of data constituting a dataset, the orders are exchanged between cycle progress and data position. Accordingly, if pieces of data that have been inputted in a bit reverse order are rearranged in the bit reverse order, the resulting data is arranged in a sequential order.

The lines ps(i) in FIG. 3 and the eight lines qs(i) in FIG. 4 each represent the data to be inputted to the subsequent stage in the ith data piece. Each of eight numbers included in a dataset, which is specifically n in x(n), is an identifier used to identify any one of FFT points.

Note that the sequential and bit reverse orders are not limited to the ones exemplified in FIGS. 3 and 4. In other words, the individual datasets in a sequential order may be created by arranging pieces of data in sequence depending on the number of FFT points, the number of cycles, and the number of data pieces processed in parallel as described above. Further, the individual datasets in a bit reverse order may be created by exchanging the orders between cycle progress and data position on the pieces of data that have been inputted in a sequential order as described above.

The first butterfly computation processing unit 21 is a butterfly circuit which handles the first one butterfly computation process 502 (the first butterfly computation process) of the two radix-8 butterfly computation processes performed in the data flow 500 shown in FIG. 8. The first butterfly computation processing unit 21 outputs results of the butterfly computation as data y(n) (where n=0, 1, ..., 63) in the sequential order shown in FIG. 3.

The second data sorting processing unit 12 rearranges the data y(n), which has been outputted from the first butterfly computation processing unit 21 in the sequential order, in the bit reverse order as shown in FIG. 4 to be inputted to the second butterfly computation processing unit 22.

The twiddle multiplication processing unit 31, which corresponds to the twiddle multiplication process 504 in the data flow 500 shown in FIG. 8, is a circuit handling rotation of a complex number on the complex plane for FFT processing after the first butterfly computation. Note that the no data rearrangement occurs in the twiddle multiplication process.

The second butterfly computation processing unit 22 is a butterfly circuit which handles the second radix-8 butterfly process 503 shown in the data flow diagram in FIG. 8. The second butterfly computation processing unit 22 performs the butterfly computation on the data y'(n) (where n=0, 1, ..., 63), which has been inputted in the bit reverse order after the twiddle multiplication, and outputs the results X(k) (where n=0, 1, ..., 63) in the same bit reverse order.

The third data sorting processing unit 13 rearranges the data X(k), which has been outputted from the second butterfly computation processing unit 22 in the bit reverse order, in the sequential order shown in FIG. 3.

The data sorting processing units achieve the respective data sorting processes in the sequential order in FIG. 3 and the bit reverse order in FIG. 4 by temporarily storing the inputted data, and controlling selection and output of the data. The following describes the data sorting processing units by way of specific examples.

Figure 5:
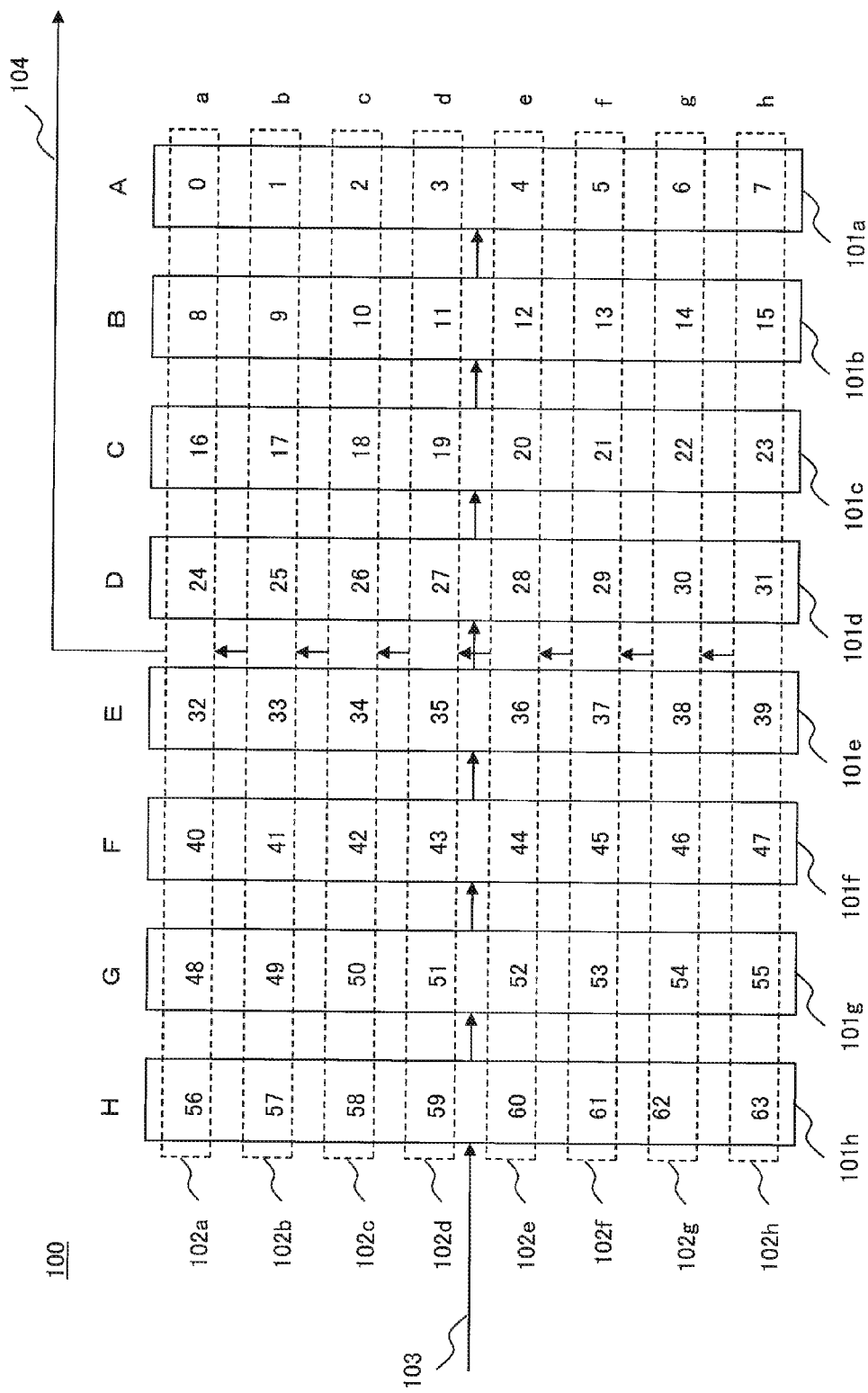
FIG. 5 is a block diagram illustrating an example configuration of a data sorting processing unit according to an exemplary embodiment of the present invention.

The first, second, and third data sorting processing units 11, 12, and 13 each can be implemented by, for example, a data sorting processing unit 100 shown in FIG. 5.

The data sorting processing unit 100 inputs the input information 103, namely datasets D1 to D8 each consisting of eight pieces of data, in the first-in order in a FIFO (First In First Out) butter, and writes and stores the datasets into data storage locations 101*a* to 101*h*. Specifically, the datasets D1 to D8 are stored in the data storage locations 101*a* to 101*h*, respectively.

The data sorting processing unit 100 then outputs the stored data in the first-out order in a FIFO buffer. Specifically, the data sorting processing unit 100 reads every eight pieces of data constituting a dataset from data read locations 102a to 102h and outputs eight datasets D1' to D8' as the output information 104. Thus, the pieces of data contained in datasets D1 to D8, which have been arranged in the order of cycle, are rearranged in the order of data location and grouped into datasets D1' to D8'.

As described above, in the FFT device 211, the first, second, and third data sorting processing units 11, 12, and 13 perform three sorting processes in total respectively in accordance with the sequential order in FIG. 3 and the bit reverse order in FIG. 4. This is because the FFT circuit 211 performs a 64-point FFT in 8-data parallel requiring 8 cycles for the FFT, which means data needs to be rearranged across cycles.

The IFFT circuit 213 can be implemented in a configuration similar to the FFT circuit 211.

Configuration of the FFT circuit 311, a component of the second digital filter circuit 300, will now be described.

Figure 6:
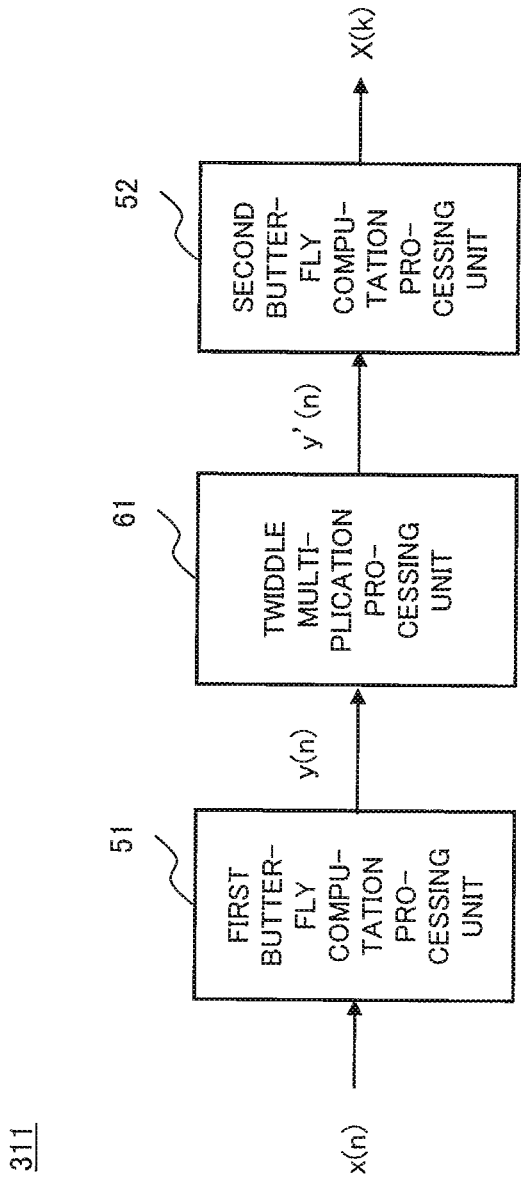
FIG. 6 is a block diagram illustrating a configuration of an FFT circuit according to an exemplary embodiment of the present invention.

FIG. 6 is a block diagram illustrating an example configuration of the FFT circuit 311 according to an exemplary embodiment of the present invention.

Figure 7:
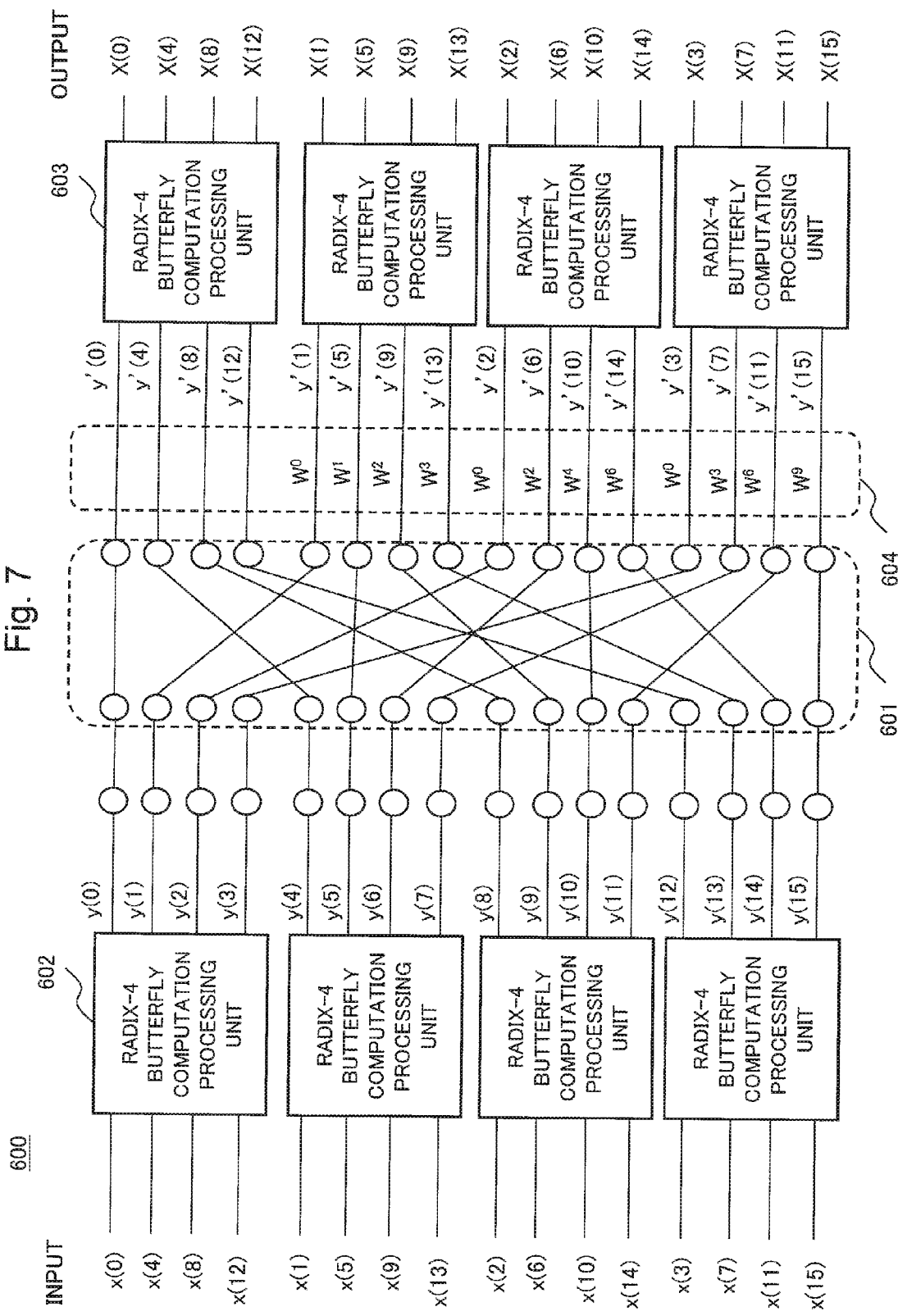
FIG. 7 is a diagram illustrating a data flow for a 16-point FFT involving two-stage butterfly computations.

The FFT circuit 311 processes a 16-point FFT decomposed into two-stage radix-4 butterfly processes based on a pipelined circuit system, according to the data flow 600 shown in FIG. 7. The FFT circuit 311 inputs time-domain data x(n) (where n=0, 1, . . . , 15) and generates and outputs frequency-domain signals X(k) (where k=0, 1, . . . , 15), which have been Fourier-transformed through an FFT process.

The 16-point FFT process in the data flow 600 shown in FIG. 7 requires a smaller amount of computation than the 64-point FFT process in the data flow 500 shown in FIG. 8. For this reason, even if a 16-point FFT, i.e., all the processes on 16 pieces of data, is implemented altogether by a single circuit, the circuit size is small. It is thus assumed here that the FFT circuit 311 performs a 16-point FFT process in 16-data parallel to achieve all the processes in the data flow 600 in a single circuit. The FFT circuit 311 in the present exemplary embodiment inputs time-domain data x(n) and generates and outputs frequency-domain signals X(k), which have been Fourier-transformed through an FFT process. During this operation, all the 16 pieces of data are inputted as input data x(n) within a period of 1 cycle.

Likewise, all the 16 pieces of data are outputted as output data X(k) within a period of 1 cycle.

The FFT circuit 311 includes a first butterfly computation processing unit 51, a twiddle multiplication processing unit 61, and a second butterfly computation processing unit 52. The FFT device 311 performs a first butterfly computation process, a twiddle multiplication process, and a second butterfly computation process in a pipelined manner.

The first butterfly computation processing unit 21 is a butterfly circuit which performs the first one butterfly computation process 602 (the first butterfly computation process) of the two radix-4 butterfly computation processes performed in the data flow 600 shown in FIG. 7. The first butterfly computation processing unit 21 outputs results of the butterfly computation as data y(n) (where n=0, 1, . . . , 63) in parallel.

The twiddle multiplication processing unit 61, which corresponds to the twiddle multiplication process 604 in the data flow 600 shown in FIG. 7, is a circuit handling rotation of a complex number on the complex plane for FFT computation after the first butterfly computation. No data rearrangement occurs in the twiddle multiplication process.

The second butterfly computation processing unit 52 is a butterfly circuit which performs the second radix-4 butterfly process 603 in the data flow diagram shown in FIG. 7. The second butterfly computation processing unit 22 performs the butterfly computation on the data y(n) (where n=0, 1, . . . , 63), which has been inputted in parallel after the butterfly computation, and outputs the results X(k) (where n=0, 1, . . . , 63) in parallel in the same manner.

As described above, the FFT circuit 311 eliminates the need for a data sorting processing unit that is required in the FFT circuit 211. This is because the FFT circuit 311 performs a 16-point FFT in 16-data parallel to complete the FFT process in one cycle, which means no data rearrangement across cycles is needed. Note that a data sorting processing unit corresponds, for example, to the data sorting process 601 in the example shown in FIG. 7 and to the data sorting process 501 in the example shown in FIG. 8.

The IFFT circuit 313 can be implemented in a configuration similar to the FFT circuit 311.

As described above, the FFT circuit 311 eliminates the need for a data sorting processing unit, and is thus smaller in circuit size than the FFT circuit 211, which requires a data sorting processing unit. Consequently, an FFT process performed by the FFT circuit 311 consumes less power due to the unnecessary data sorting processing unit than an FFT process performed by the FFT circuit 211.

Thus, when the number of points of an FFT process is small, power consumption for an FFT process can be reduced by using the FFT process performed by the FFT circuit 311. In contrast, when the number of points of an FFT is too many to handle in parallel and may be problematic in terms of circuit size, the FFT circuit 211, which is an FFT circuit involving a data sorting process, can be used.

In this case, all the output data can be obtained within one cycle due to the effect of data sorting processing.

Operations of Exemplary Embodiment

The overlap value M for the first digital filter circuit 200 is 16. In other words, the first digital filter circuit 200 can perform filtering of an up to 16-tap long impulse response.

On the other hand, the overlap value Q for the second digital filter circuit 300 is 4. In other words, the second digital filter circuit 300 can perform filtering of an up to 4-tap long impulse response.

The digital filter circuit 400 uses the second digital filter circuit 300 to perform filtering if the impulse response length of filtering is 4 taps or less, whereas it uses the first digital filter circuit 200 to perform filtering if the impulse response length of filtering is 5 taps or more.

Specifically, the digital filter circuit 400 operates as follows depending on the impulse response length of the filtering performed by the digital filter circuit 400:

1) In cases where the impulse response length is 4 taps or less

A selection signal 411, which instructs to select the second digital filter circuit 300, is given by an upper-level circuit (not shown), such as a CPU. The second digital filter circuit 300, which has been selected by the selection signal 411, performs filtering.

Meanwhile, the first digital filter circuit 200, which is not selected by the selection signal 411, suspends filtering. During the suspension, the first digital filter circuit 200 can reduce power consumption by using clock gating, power gating, or the like to stop circuit operations.

In accordance with the selection signal 411, the data selection unit 410 outputs the data, as output data, outputted from the second digital filter circuit 300.

2) In cases where the impulse response length is 5 taps or more

A selection signal 411, which instructs to select the first digital filter circuit 200, is given by an upper-level circuit. The first digital filter circuit 200, which has been selected by the selection signal 411, performs filtering. The second digital filter circuit 300, which is not selected by the selection signal 411, suspends filtering. During the suspension, the second digital filter circuit 300 can reduce power consumption by using clock gating, power gating, or the like to stop circuit operations.

In accordance with the selection signal 411, the data selection unit 410 outputs the data, as output data, outputted from the first digital filter circuit 200.

Effect of Exemplary Embodiments

As described above, the digital filter circuit 400 according to the present exemplary embodiment is configured such that the first digital filter circuit 200, which can accept a longer impulse response, and the second digital filter circuit 300, which can accept a shorter impulse response, are connected to each other in parallel. In operation, the second digital filter circuit 300 consumes less power compared with the first digital filter circuit 200. It can be determined which circuit should be selected, the first digital filter circuit 200 or the second digital filter circuit 300, depending on the impulse response length of the target filtering to be performed.

The first digital filter circuit 200 is used when the impulse response length of the target filtering is greater than a predetermined value, whereas the second digital filter circuit 300 is used when the impulse response length of the target filtering is equal to or less than a predetermined value. Therefore, power consumption for filtering can be reduced when the impulse response length is equal to or less than a predetermined value. When the impulse response length is greater than a predetermined value, power consumption is greater because a data sorting process is involved, but all the output data can be outputted within one cycle notwithstanding parallel processing.

Note that the present exemplary embodiment assumes that the overlap value M for the first digital filter circuit 200 is 16, the FFT block size N is 64, the overlap value P for the second digital filter circuit 300 is 4, and the FFT block size Q is 16, but values are not limited thereto. The overlap value and FFT block size for the second digital filter circuit 300 may be set to any values as far as an FFT process can be performed in one cycle. The overlap value and FFT block size for the first digital filter circuit 200 may be set to any values as far as they are greater than the overlap value and FFT block size, respectively, for the second digital filter circuit 300.

In the present exemplary embodiment, it is envisaged that individual processes, such as FFT, IFFT, and filtering, are performed by individual circuits or other components. However, the processes according to the respective exemplary embodiments may be executed by a computer included in a predetermined device, such as a digital signal processor (DSP), in accordance with software that is provided thereon. That is, computer programs responsible for the respective processes are loaded and executed by a DSP (not shown).

For example, the data sorting process may be performed through the use of a program. That is, a DSP and memory may be used to perform the data sorting process by causing a program to control reading and writing data from and to the memory. In addition, in the present exemplary embodiment, FFT processes may be performed under program control.

As described above, programs may be used to perform the same processes as those described in the above exemplary embodiments.

Note that the above processing programs may be stored in a non-transitory medium, including but not limited to, a semiconductor storage device such as ROM (read only memory), RAM (random access memory), or flash memory, or an optical disk, a magnetic disk, or a magneto-optical disk.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

This application is based upon and claims the benefit of priority from Japanese patent application No. 2013-152705, filed on Jul. 23, 2013, the disclosure of which is incorporated herein in its entirety by reference.

REFERENCE SIGNS LIST

11 First data sorting processing unit
12 Second data sorting processing unit
13 Third data sorting processing unit
21 First butterfly computation processing unit
22 Second butterfly computation processing unit
31 Twiddle multiplication processing unit
51 First butterfly computation processing unit
52 Second butterfly computation processing unit
61 Twiddle multiplication processing unit
100 Data sorting processing unit
101*a* to 101*h* Data storage location
102*a* to 102*h* Data read location
103 Inputted information
104 Outputted information
200 First digital filter circuit
210 Overlap addition circuit
211 FFT circuit
212 Filter computation circuit
213 IFFT circuit
214 Overlap removal circuit
300 Second digital filter circuit
310 Overlap addition circuit
311 FFT circuit
312 Filter computation circuit
313 IFFT circuit
314 Overlap removal circuit
400 Digital filter circuit
410 Data selection unit
411 Selection signal
500 Data flow
501 Data sorting process
502, 503 Butterfly computation process
504 Twiddle multiplication process
505*a*-505*h* Partial data flow
600 Data flow
601 Data sorting process
602, 603 Butterfly computation process
604 Twiddle multiplication process
700 Digital filter circuit
710 Overlap addition circuit 711 FFT circuit
712 Filter computation circuit
713 IFFT circuit
714 Overlap removal circuit

What is claimed is:

1. A digital filter device comprising:
a first digital filtering unit comprising:
   a first overlap addition unit which generates a first overlap block where a first input block comprising time-domain consecutive N–M pieces of input data (where N is a positive integer and M is a positive integer equal to or less than N) is given additional consecutive M pieces of data immediately preceding the first input block;
   a first fast Fourier transform unit which transforms, through a fast Fourier transform process involving a first data sorting process, the first overlap block into a first frequency-domain block being in a frequency domain;
   a first filter computation unit which performs a first filtering process on the first frequency-domain block;
   a first inverse fast Fourier transform unit which transforms, through an inverse fast Fourier transform process involving a second data sorting process, the first processed block which underwent the first filtering process into a first time-domain block; and
   a first overlap removal unit which removes a total of M pieces of data from both ends of a time axis of the first time-domain block and generates first output data;
a second digital filtering unit comprising:
   a second overlap addition unit which generates a second overlap block where a second input block comprising time-domain consecutive Q–P pieces of input data (where Q is a positive integer and P is a positive integer equal to or less than Q) is given additional consecutive P pieces of data immediately preceding the second input block;
   a second fast Fourier transform unit which simultaneously inputs all the second input block included in the second overlap block and transforms, through a fast Fourier transform process, the block into a second frequency-domain block being in a frequency domain;
   a second filter computation unit which performs a second filtering process on the second frequency-domain block;
   a second inverse fast Fourier transform unit which simultaneously inputs all processed data included in the second processed block which underwent the second filtering process and transforms, through an inverse fast Fourier transform process, the processed data into a second time-domain block; and
   a second overlap removal unit which removes a total of P pieces of data from both ends of a time axis of the second time-domain block and generates second output data; and
a data selection unit which selects either the first output data or the second output data in accordance with a selection signal selecting a filtering process to be performed,
wherein the second digital filtering unit stops operating when the first output data is selected by the data selection unit,
and wherein the first digital filtering unit stops operating when the second output data is selected by the data selection unit, wherein a first impulse response length of the first filtering process is longer than a second impulse response length of the second filtering process,
wherein the M is determined based on the first impulse response length,
and wherein the P is determined based on the second impulse response length.

2. The digital filter device according to claim 1,
wherein the N is greater than the Q,
and wherein the M is greater than the P.

3. The digital filter device according to claim 2, wherein the first data sorting process is a process carried out to rearrange a plurality of pieces of the input data included in the first overlap block in an order of data pieces to be subjected to computation in the first fast Fourier transform unit,
and wherein the second data sorting process is a process carried out to rearrange a plurality of pieces of processed data included in the first processed block in an order of data pieces to be subjected to computation in the first inverse fast Fourier transform unit.

4. The digital filter device according to claim 3, wherein the selection signal selects the first filtering process if an impulse response length of an applicable filtering process to be applied to input data is greater than the P,
and wherein the selection signal selects the second filtering process if an impulse response length of the applicable filtering process is equal to or less than the P.

5. The digital filter device according to claim 1, wherein the first data sorting process is a process carried out to rearrange a plurality of pieces of the input data included in the first overlap block in an order of data pieces to be subjected to computation in the first fast Fourier transform unit,
and wherein the second data sorting process is a process carried out to rearrange a plurality of pieces of processed data included in the first processed block in an order of data pieces to be subjected to computation in the first inverse fast Fourier transform unit.

6. The digital filter device according to claim 5, wherein the selection signal selects the first filtering process if an impulse response length of an applicable filtering process to be applied to input data is greater than the P,
and wherein the selection signal selects the second filtering process if an impulse response length of the applicable filtering process is equal to or less than the P.

7. The digital filter device according to claim 1, wherein the selection signal selects the first filtering process if an impulse response length of an applicable filtering process to be applied to input data is greater than the P,
and wherein the selection signal selects the second filtering process if an impulse response length of the applicable filtering process is equal to or less than the P.

8. The digital filter device according to claim 2, wherein the selection signal selects the first filtering process if an impulse response length of an applicable filtering process to be applied to input data is greater than the P,
and wherein the selection signal selects the second filtering process if an impulse response length of the applicable filtering process is equal to or less than the P.

9. A digital filter device comprising:
a first digital filtering unit comprising:
   a first overlap addition unit which generates a first overlap block where a first input block comprising time-domain consecutive N–M pieces of input data (where N is a positive integer and M is a positive integer equal to or less than N) is given additional consecutive M pieces of data immediately preceding the first input block;

a first fast Fourier transform unit which transforms, through a fast Fourier transform process involving a first data sorting process, the first overlap block into a first frequency-domain block being in a frequency domain;

a first filter computation unit which performs a first filtering process on the first frequency-domain block;

a first inverse fast Fourier transform unit which transforms, through an inverse fast Fourier transform process involving a second data sorting process, the first processed block which underwent the first filtering process into a first time-domain block; and a first overlap removal unit which removes a total of M pieces of data from both ends of a time axis of the first time-domain block and generates first output data;

a second digital filtering unit comprising:

a second overlap addition unit which generates a second overlap block where a second input block comprising time-domain consecutive Q–P pieces of input data (where Q is a positive integer and P is a positive integer equal to or less than Q) is given additional consecutive P pieces of data immediately preceding the second input block;

a second fast Fourier transform unit which simultaneously inputs all the second input block included in the second overlap block and transforms, through a fast Fourier transform process, the block into a second frequency-domain block being in a frequency domain;

a second filter computation unit which performs a second filtering process on the second frequency-domain block;

a second inverse fast Fourier transform unit which simultaneously inputs all processed data included in the second processed block which underwent the second filtering process and transforms, through an inverse fast Fourier transform process, the processed data into a second time-domain block; and a second overlap removal unit which removes a total of P pieces of data from both ends of a time axis of the second time-domain block and generates second output data; and a data selection unit which selects either the first output data or the second output data in accordance with a selection signal selecting a filtering process to be performed, wherein the second digital filtering unit stops operating when the first output data is selected by the data selection unit, and wherein the first digital filtering unit stops operating when the second output data is selected by the data selection unit, wherein the selection signal selects the first filtering process if an impulse response length of an applicable filtering process to be applied to input data is greater than the P, and wherein the selection signal selects the second filtering process if an impulse response length of the applicable filtering process is equal to or less than the P.

10. The digital filter device according to claim 9, wherein the first data sorting process is a process carried out to rearrange a plurality of pieces of the input data included in the first overlap block in an order of data pieces to be subjected to computation in the first fast Fourier transform unit, and wherein the second data sorting process is a process carried out to rearrange a plurality of pieces of processed data included in the first processed block in an order of data pieces to be subjected to computation in the first inverse fast Fourier transform unit.

11. A digital filtering method comprising:

selecting, in accordance with a selection signal selecting a filtering process to be performed, either:

a first digital filtering process performed to:

generate a first overlap block where a first input block comprising time-domain consecutive N–M pieces of input data (where N is a positive integer and M is a positive integer equal to or less than N) is given additional consecutive M pieces of data immediately preceding the first input block;

transform, through a fast Fourier transform process involving a first data sorting process, the first overlap block into a first frequency-domain block being in a frequency domain;

perform a first filtering process on the first frequency-domain block;

transform, through an inverse fast Fourier transform process involving a second data sorting process, the first processed block which underwent the first filtering process into a first time-domain block; and remove a total of M pieces of data from both ends of a time axis of the first time-domain block and generate first output data; or a second digital filtering process performed to:

generate a second overlap block where a second input block comprising time-domain consecutive Q–P pieces of input data (where Q is a positive integer and P is a positive integer equal to or less than Q) is given additional consecutive P pieces of data immediately preceding the second input block;

simultaneously input all the second input block included in the second overlap block and transform, through a fast Fourier transform process, the block into a second frequency-domain block being in a frequency domain;

perform a second filtering process on the second frequency-domain block;

simultaneously input all processed data included in the second processed block which underwent the second filtering process and transform, through an inverse fast Fourier transform process, the processed data into a second time-domain block; and remove a total of P pieces of data from both ends of a time axis of the second time-domain block and generate second output data;

stopping the first digital filtering process when the second digital filtering process is selected; and stopping the second digital filtering process when the first digital filtering process is selected, wherein a first impulse response length of the first filtering process is longer than a second impulse response length of the second filtering process, wherein the M is determined based on the first impulse response length, and wherein the P is determined based on the second impulse response length.

* * * * *